United States Patent
Yu et al.

(10) Patent No.: US 10,772,170 B2
(45) Date of Patent: Sep. 8, 2020

(54) TRIAC DIMMER DETECTION CIRCUIT, CHIP AND METHOD, AND LED DRIVING CHIP AND SYSTEM

(71) Applicant: SHANGHAI BRIGHT POWER SEMICONDUCTOR CO., LTD., Shanghai (CN)

(72) Inventors: Weijia Yu, Shanghai (CN); Minmin Fan, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/143,457

(22) Filed: Sep. 27, 2018

(65) Prior Publication Data

US 2019/0150240 A1 May 16, 2019

(30) Foreign Application Priority Data

Nov. 14, 2017 (CN) .......................... 2017 1 1125371

(51) Int. Cl.
- *H05B 33/08* (2020.01)
- *H05B 45/10* (2020.01)
- *G01R 31/44* (2020.01)
- *H05B 45/37* (2020.01)

(52) U.S. Cl.
CPC ............ *H05B 45/10* (2020.01); *G01R 31/44* (2013.01); *H05B 45/37* (2020.01)

(58) Field of Classification Search
CPC ............ H05B 33/0815; H05B 33/0833; H05B 33/0845; H05B 33/0848

USPC ...................................... 315/185 R, 297, 307
See application file for complete search history.

(56) References Cited

U.S. PATENT DOCUMENTS

| | | | |
|---|---|---|---|
| 8,653,750 B2 | 2/2014 | Deurenberg et al. | |
| 9,155,147 B2* | 10/2015 | Kim | H05B 45/37 |
| 2012/0043902 A1* | 2/2012 | Kanamori | H05B 33/0815 315/223 |
| 2013/0278159 A1* | 10/2013 | Del Carmen, Jr. | H05B 33/0809 315/200 R |
| 2015/0163873 A1* | 6/2015 | Kawai | H05B 33/0815 315/127 |
| 2017/0354008 A1* | 12/2017 | Eum | H02M 3/33515 |
| 2018/0115234 A1* | 4/2018 | Liu | H02M 1/00 |
| 2018/0295685 A1* | 10/2018 | Wang | H05B 33/0845 |

* cited by examiner

*Primary Examiner* — Tung X Le

(74) *Attorney, Agent, or Firm* — Global IP Services; Tianhua Gu

(57) ABSTRACT

Provided are a TRIAC dimmer detection circuit, chip and method, and an LED driving chip and system. A bus voltage reflecting signal is received, and a TRIAC dimmer detection signal is generated according to the bus voltage reflecting signal, a first reference voltage and a second reference voltage, the dimmer detection signal being used to detect whether a dimmer exists and to determine the type of the dimmer. The TRIAC dimmer detection circuit, chip and method, and the LED driving chip and system consistent with the present invention can detect whether a TRIAC dimmer is contained in an LED illuminating system, so as to determine a working state of a bleeder, thereby reducing the power consumption of the entire LED illuminating system and improving the efficiency thereof.

30 Claims, 7 Drawing Sheets

TRIAC DIMMER DETECTION CIRCUIT, CHIP AND METHOD, AND LED DRIVING CHIP AND SYSTEM

BACKGROUND OF THE PRESENT INVENTION

Field of Invention

The present invention relates to the technical field of electronic circuits, and more particularly to a TRIAC dimmer detection circuit, chip and method, and an LED driving chip and system.

Description of Related Arts

An LED illuminator, namely a lighting emitting diode illuminator, is a semiconductor solid light emitting device. By using a solid semiconductor chip as a light emitting material, the LED illuminator directly emits red light, yellow light, blue light, and green light by releasing excess energy through carrier recombination in a semiconductor to cause photon emission, and may emit light of any color by adding fluorescent powder by virtue of a principle of three primary colors on this basis. An illuminating appliance manufactured by using an LED as a light source is an LED lamp.

A dimmer is used to adjust different luminance of lamplight, which urges to output different intensity of light generated from an average power of lamplight by reducing or increasing an RMS voltage. Usually, a TRIAC dimmer is composed of a main loop, a trigger loop, a control loop, a feedback system, etc.

Because of the features of high efficiency and energy saving, the LED illuminator has been widely used to replace traditional incandescent lamps and fluorescent lamps, etc. For an LED illuminating system with a TRIAC dimmer, on account of the own features of the TRIAC dimmer, a certain size of holding current is required during TRIAC turn-on, so as to maintain a reliable on state of the TRIAC dimmer. Therefore, an LED driver applicable to the TRIAC dimmer may usually have a corresponding bleeder. When a main loop current is smaller than a TRIAC holding current, the bleeder may provide an extra current to maintain TRIAC anon state. However, when the LED driver with the bleeder is applied to an LED illuminating system without a TRIAC dimmer, a holding circuit will bring an additional loss, thereby reducing the efficiency of the entire LED illuminating system.

SUMMARY OF THE PRESENT INVENTION

In view of the above defects in the prior art, an object of the present invention is to provide a TRIAC dimmer detection circuit, chip and method, and an LED driving chip and system, which can detect whether a TRIAC dimmer is contained in an LED illuminating system, so as to determine a working state of a bleeder, thereby reducing the power consumption of the entire LED illuminating system and improving the efficiency thereof.

In order to accomplish the above object and other related objects, the present invention provides a TRIAC dimmer detection circuit, which is configured to receive a signal representing a bus voltage, and generate a TRIAC dimmer detection signal according to the signal representing the bus voltage, a first reference voltage and a second reference voltage, the TRIAC dimmer detection signal is used to indicate whether a dimmer exists and to determine the type of the dimmer.

In an embodiment of the present invention, the signal representing the bus voltage is acquired after dividing a detected bus voltage via a voltage division unit.

In an embodiment of the present invention, the detection circuit comprises:

a comparison circuit, configured to generate a first processing signal and a second processing signal according to the signal representing the bus voltage, the first reference voltage and the second reference voltage; and a control unit, configured to generate a TRIAC dimmer detection signal according to the first processing signal and the second processing signal.

In an embodiment of the present invention, the comparison circuit comprises a first comparator and a second comparator;

a positive input end of the first comparator is connected to the first reference voltage, and a negative input end is connected to the signal representing the bus voltage, and outputs the first processing signal; and a positive input end of the second comparator is connected to the second reference voltage, and a negative input end receives the signal representing the bus voltage, and outputs the second processing signal.

In an embodiment of the present invention, the control unit comprises a first control unit;

the first control unit comprises a first delay circuit, a first logic module, a first counter and a second logic module; the first delay circuit delays the first processing signal; the first logic module receives the delayed first processing signal and the second processing signal, logically processes the delayed first processing signal and the second processing signal, and then outputs a first logic signal to a low-level valid zero clearing end of the first counter; a clock input end of the first counter is connected to an output end of a second logic module, and an output end of the first counter is connected to an input end of the second logic module; and the second logic module generates a TRIAC dimmer detection signal according to the first processing signal, the first dimmer detection signal is a leading-edge phase-cut TRIAC dimmer detection signal.

In an embodiment of the present invention, the control unit comprises a second control unit;

the second control unit comprises a second delay circuit, a third logic module, a second counter and a fourth logic module; the second delay circuit delays the second processing signal; the third logic module receives the delayed second processing signal and the first processing signal, logically processes the delayed second processing signal and the first processing signal, and then outputs the second logic signals to a low-level valid zero clearing end of the second counter; a clock input end of the second counter is connected to an output end of the fourth logic module, and an output end of the second counter is connected to an input end of the fourth logic module; and the fourth logic module generates a TRIAC dimmer detection signal according to the first processing signal, the TRIAC dimmer detection signal is a trailing-edge phase-cut TRIAC dimmer detection signal.

In an embodiment of the present invention, the control unit comprises a first control unit and a second control unit, which output a first dimmer detection signal and a second dimmer detection signal respectively;

the first control unit comprises a first delay circuit, a first logic module, a first counter and a second logic module; the first delay circuit delays the first processing signal; the first logic module receives the delayed first processing signal and the second processing signal, logically processes the delayed first processing signal and the second processing signal, and then outputs a first logic signals to a low-level valid zero clearing end of the first counter; a clock input end of the first counter is connected to an output end of the second logic module, and an output end is connected to an input end of the second logic module; the second logic module generates a first dimmer detection signal according to the first processing signal, the first dimmer detection signal is a leading-edge phase-cut TRIAC dimmer detection signal;

the second control unit comprises a second delay circuit, a third logic module, a second counter and a fourth logic module;

the second delay circuit delays the second processing signal; the third logic module receives the delayed second processing signal and the first processing signal, logically processes the delayed second processing signal and the first processing signal, and then outputs a second signals to a low-level valid zero clearing end of the second counter; a clock input end of the second counter is connected to an output end of the fourth logic module, and an output end is connected to an input end of the fourth logic module; and the fourth logic module generates a second dimmer detection signal according to the first processing signal, the second dimmer detection signal is a trailing-edge phase-cut TRIAC dimmer detection signal.

In an embodiment of the present invention, the first logic module comprises a first D flip-flop, and the second logic module comprises a first OR gate and a NOT gate;

a trigger end C of the first D flip-flop is connected to an output end of the first delay circuit, an input end D is connected to an output end of the second comparator, and an output end Q is connected to a low-level valid zero clearing end of the first counter; an output end of the first counter is connected to a first input end of the first OR gate; an input end of the NOT gate is connected to an output end of the first comparator, and an output end is connected to a second input end of the first OR gate; and an output end of the first OR gate outputs a leading-edge phase-cut TRIAC dimmer detection signal.

In an embodiment of the present invention, the third logic module comprises a second D flip-flop, and the fourth logic module comprises a second OR gate and a NOT gate;

a trigger end C of the second D flip-flop is connected to an output end of the second delay circuit, an input end D is connected to an output end of the first comparator, and an output end Q is connected to a low-level valid zero clearing end of the second counter; an input end of the NOT gate is connected to an output end of the first comparator; and a first input end of the second OR gate is connected to an output end of the second counter, a second input end is connected to an output end of the NOT gate, and an output end outputs a trailing-edge phase-cut TRIAC dimmer detection signal.

In an embodiment of the present invention, the first logic module comprises a first D flip-flop, the second logic module comprises a first OR gate and a NOT gate, the third logic module comprises a second D flip-flop, and the fourth logic module comprises a second OR gate and a NOT gate;

a trigger end C of the first D flip-flop is connected to an output end of the first delay circuit, an input end D is connected to an output end of the second comparator, and an output end Q is connected to a low-level valid zero clearing end of the first counter; an output end of the first counter is connected to a first input end of the first OR gate; an input end of the NOT gate is connected to an output end of the first comparator, and an output end is connected to a second input end of the first OR gate; an output end of the first OR gate outputs the leading-edge phase-cut TRIAC dimmer detection signal;

a trigger end C of the second D flip-flop is connected to an output end of the second delay circuit, an input end D is connected to an output end of the first comparator, and an output end Q is connected to a low-level valid zero clearing end of the second counter; an input end of the NOT gate is connected to an output end of the first comparator; and a first input end of the second OR gate is connected to an output end of the second counter, a second input end is connected to an output end of the NOT gate, and an output end outputs the trailing-edge phase-cut TRIAC dimmer detection signal.

In an embodiment of the present invention, when the first counter counts to a first preset number, the leading-edge phase-cut TRIAC dimmer detection signal is in a high level, and counting is stopped.

In an embodiment of the present invention, when the first counter counts to a first preset number, the leading-edge phase-cut TRIAC dimmer detection signal is effective, and counting is stopped, and when the second counter counts to a second preset number, the trailing-edge phase-cut TRIAC dimmer detection signal is effective, and counting is stopped.

In an embodiment of the present invention, the voltage division unit comprises a first resistor and a second resistor, connected in series; one end of the first resistor is connected to a rectified voltage obtained after rectifying an input alternating current, and the other end of the second resistor is grounded; and a connecting node between the first resistor and the second resistor outputs the signal representing the bus voltage.

In an embodiment of the present invention, the second reference voltage is smaller than $R2/(R1+R2)*\sqrt{2}*Vac*\sin(\theta max)$, where $R1$ and $R2$ are a resistance value of the first resistor and a resistance value of the second resistor, respectively, $Vac$ is an input alternating voltage, $\theta max$ is a maximum turn-on angle of a TRIAC dimmer.

In an embodiment of the present invention, the first reference voltage is smaller than the second reference voltage.

In an embodiment of the present invention, the first delay circuit and the second delay circuit have the same delay duration, which is equal to $(\arcsin(Vt2*(R1+R2)/R2/\sqrt{2}/Vac)-\arcsin(Vt1*(R1+R2)/R2/\sqrt{2}/Vac))/2$, where $R1$ and $R2$ are a resistance value of the first resistor and a resistance value of the second resistor, respectively, $Vac$ is an input alternating voltage, $Vt1$ and $Vt2$ are a first reference voltage and a second reference voltage, respectively.

In an embodiment of the present invention, the first delay circuit is a rising edge delay unit, which delays a rising edge of the signal representing the bus voltage to a certain delay duration; and the second delay circuit is a falling edge delay unit, which delays a falling edge of the signal representing the bus voltage to a certain delay duration, the delay duration are smaller than a duration in which the signal representing the bus voltage rises from the first reference voltage to the second reference voltage in the absence of a TRIAC dimmer, and are smaller than a duration in which the reflecting signal bus voltage falls from the second reference voltage to the first reference voltage in the absence of a TRIAC dimmer.

The present invention further
provides an LED driving system, comprising:
a rectification unit, configured to rectify an input alternating current and then output it to an LED load;
an energy storage unit, connected to an input end and an output end of the LED load;

an LED driving circuit, configured to provide current for the LED load;

a foregoing TRIAC dimmer detection circuit, configured to generate a leading-edge phase-cut TRIAC dimmer detection signal and/or a trailing-edge phase-cut TRIAC dimmer detection signal according to a signal representing the bus voltage; and a bleeder, configured to make a turn-on or turn-off response according to the dimmer detection signal, wherein when a current of the LED driving circuit is smaller than a minimum current for maintaining an on state of a TRIAC dimmer, the bleeder adjusts a working mode thereof according to the dimmer detection signal, and provides an extra current to maintain the on state of the TRIAC dimmer.

In an embodiment of the present invention, the LED driving circuit and the TRIAC dimmer detection circuit may be integrated in an LED driving chip, or the LED driving circuit may be integrated in an LED driving chip, and the TRIAC dimmer detection circuit may be integrated in a TRIAC dimmer detection chip.

Moreover, the present invention provides a TRIAC dimmer detection method, comprising the following steps:

step 1: acquiring a signal representing the bus voltage; and step 2: generating a TRIAC dimmer detection signal according to the signal representing the bus voltage, a first reference voltage and a second reference voltage.

In an embodiment of the present invention, step 2 comprises:

generating a first processing signal according to the signal representing the bus voltage and the first reference voltage, and delaying the first processing signal; generating a second processing signal according to the signal representing the bus voltage;

generating a TRIAC dimmer detection signal according to the first processing signal, the second processing signal and the delayed first processing signal, the TRIAC dimmer detection signal being a trailing-edge phase-cut TRIAC dimmer detection signal.

In an embodiment of the present invention, step 2 comprises:

generating a first processing signal according to the signal representing the bus voltage and the first reference voltage; generating a second processing signal according to the signal representing the bus voltage and the second reference voltage, and delaying the second processing signal;

generating a TRIAC dimmer detection signal according to the first processing signal, the second processing signal and the delayed second processing signal, the TRIAC dimmer detection signal is a trailing-edge phase-cut TRIAC dimmer detection signal.

In an embodiment of the present invention, step 2 comprises:

generating a first processing signal according to the signal representing the bus voltage and the first reference voltage, and delaying the first processing signal; generating a second processing signal according to the signal representing the bus voltage and the second reference voltage, and delaying the second processing signal;

generating a TRIAC dimmer detection signal according to the first processing signal, the second processing signal and the delayed first processing signal, the first TRIAC dimmer detection signal is a leading-edge phase-cut TRIAC dimmer detection signal; and generating a second TRIAC dimmer detection signal according to the first processing signal, the second processing signal and the delayed second processing signal, the second TRIAC dimmer detection signal is a trailing-edge phase-cut TRIAC dimmer detection signal.

In an embodiment of the present invention, step 2 comprises:

counting a rising edge of the delayed first processing signal, when counting to a first preset number, outputting a leading-edge phase-cut TRIAC dimmer detection signal, and stopping counting, the leading-edge phase-cut TRIAC dimmer detection signal being at a high level; and/or, counting a falling edge of the delayed second processing signal, when counting to a second preset number, outputting a trailing-edge phase-cut TRIAC dimmer detection signal, and stopping counting, the trailing-edge phase-cut TRIAC dimmer detection signal effective, wherein the first preset number is integers. In an embodiment of the present invention, step 2 comprises:

counting a falling edge of the delayed second processing signal, when counting to a second preset number, outputting a trailing-edge phase-cut TRIAC dimmer detection signal, and stopping counting, the trailing-edge phase-cut TRIAC dimmer detection signal is effective, wherein the second preset number is integers.

In an embodiment of the present invention, step 2 comprises:

counting a rising edge of the delayed first processing signal, when counting to a first preset number, outputting a leading-edge phase-cut TRIAC dimmer detection signal, and stopping counting, the leading-edge phase-cut TRIAC dimmer detection signal is effective; counting a falling edge of the delayed second processing signal, when counting to a second preset number, outputting a trailing-edge phase-cut TRIAC dimmer detection signal, and stopping counting, the trailing-edge phase-cut TRIAC dimmer detection signal is effective, wherein the first preset number and the second preset number are integers.

In an embodiment of the present invention, step 1 comprises: connecting one end of a first resistor and a second resistor, connected in series, to a rectified voltage obtained after rectifying an input alternating current, and grounding the other end; and outputting, by a connecting point between the first resistor and the second resistor, the signal representing the bus voltage.

In an embodiment of the present invention, the second reference voltage is smaller than $R2/(R1+R2)*\sqrt{2}*Vac*\sin(\theta max)$, where R1 and R2 are the resistance of the first resistor and the resistance of the second resistor, respectively, Vac is an input alternating voltage, $\theta max$ is a maximum turn-on angle of a TRIAC dimmer, and the first reference voltage is smaller than the second reference voltage.

In an embodiment of the present invention, the first reference voltage is smaller than the second reference voltage.

In an embodiment of the present invention, the first processing signal and the second processing signal have the same delay duration: $(\arcsin(Vt2*(R1+R2)/R2/\sqrt{2}/Vac)-\arcsin(Vt1*(R1+R2)/R2/\sqrt{2}/Vac))/2$, where R1 and R2 are a resistance value of the first resistor and a resistance value of the second resistor, respectively, Vac is an input alternating voltage, Vt1 and Vt2 are a first reference voltage and a second reference voltage, respectively, and the R2 is close to a grounded end.

In an embodiment of the present invention, a delay duration is smaller than a duration in which the signal representing the bus voltage rises from the first reference voltage to the second reference voltage in the absence of a TRIAC dimmer, and are smaller than a duration in which the signal representing the bus voltage falls from the second reference voltage to the first reference voltage in the absence of a TRIAC dimmer.

As mentioned above, the TRIAC dimmer detection circuit, chip and method, and the LED driving chip and system consistent with the present invention have the following beneficial effects.

(1) It can be detected whether a TRIAC dimmer is contained in an LED illuminating system, so as to determine a working state of a bleeder.

(2) When it is detected that there is no TRIAC dimmer, the bleeder is completely closed, and when it is detected that there is a TRIAC dimmer, the bleeder adopts a corresponding working mode according to the type of the TRIAC dimmer.

(3) The power consumption of the bleeder is reduced, and the efficiency of the LED illuminating system is improved.

DETAILED DESCRIPTION OF THE PREFERRED EMBODIMENTS

Figure 1:
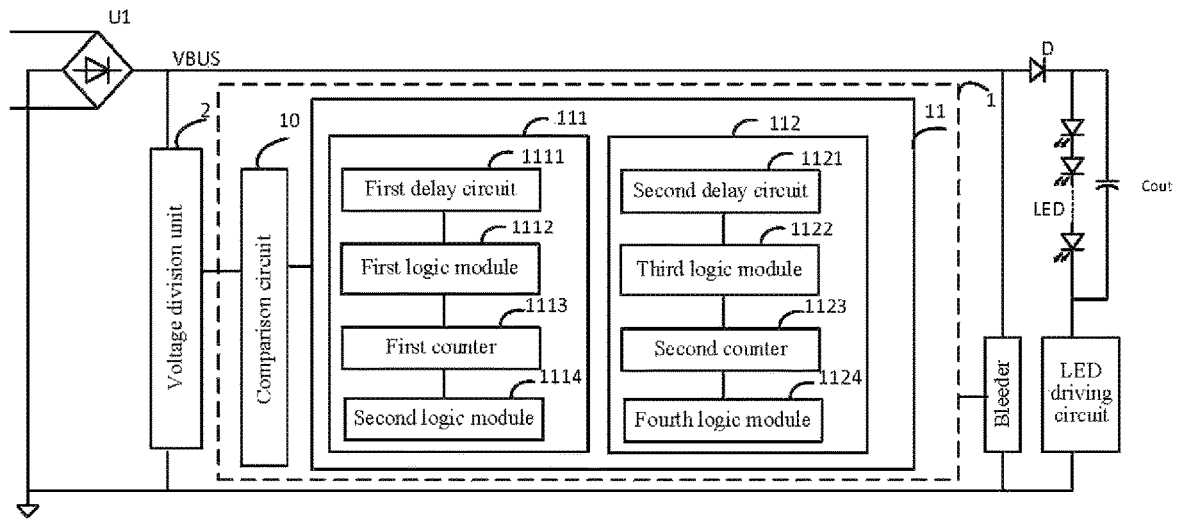
FIG. 1 is a schematic structure diagram of a TRIAC dimmer detection circuit according to an embodiment of the present invention.

The implementation manners of the present invention will be described below with reference to specific embodiments. Those skilled in the art may easily understand other advantages and effects of the present invention by the contents disclosed in the present specification.

It should be noted that the structures, proportions, sizes, and the like shown in the drawings of the present specification are only used to cooperate with the contents disclosed in the specification for those skilled in the art to understand and read, and are not intended to limit the implementable limiting conditions of the present invention, so they are not technically meaningful. Modifications of any structure, changes in the proportional relationship or adjustments in size should fall within the scope coverable by the disclosed technical content of the present invention without affecting the effects that can be achieved by the present invention and the objects that can be accomplished by the present invention. Meanwhile, the terms such as "upper", "lower", "left", "right", "middle", and "one" cited in the present specification are also for ease of description only and not for limiting the implementable scope of the present invention. The changes or adjustments of a relative relation should be regarded as the implementable scope of the present invention without substantially changing the technical content.

A TRIAC dimmer detection circuit, chip and method, and an LED driving chip and system according to the present invention can detect whether an LED illuminating system comprises a TRIAC dimmer. When it is detected that there is no TRIAC dimmer, a bleeder is completely shut down, and when it is detected that there is a TRIAC dimmer, the bleeder adopts a corresponding working mode according to the type of the TRIAC dimmer, thereby reducing the power consumption of the entire LED illuminating system, and improving the efficiency thereof.

The TRIAC dimmer detection circuit according to the present invention receives a signal representing the bus voltage, and generates a TRIAC dimmer detection signal according to the signal representing the bus voltage, a first reference voltage and a second reference voltage, so as to control a working state of a bleeder according to the TRIAC dimmer detection signal.

A specific structure of the TRIAC dimmer detection circuit consistent with the present invention is further elaborated below with specific embodiments.

Figure 2:
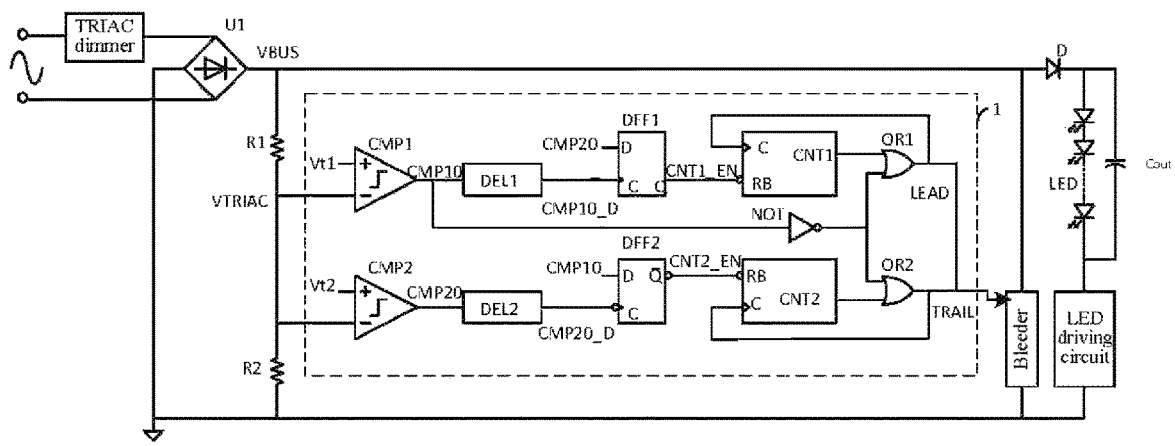
FIG. 2 is a schematic circuit diagram of a TRIAC dimmer detection circuit according to another embodiment of the present invention.

As shown in FIG. 1, in this embodiment, the TRIAC dimmer detection circuit according to the present invention generates a TRIAC dimmer detection signal by detecting the signal representing the bus voltage. The TRIAC dimmer detection circuit as shown in FIG. 1 can output the dimmer detection signal, including a leading-edge phase-cut TRIAC dimmer detection signal and a trailing-edge phase-cut TRIAC dimmer detection signal, and the signal representing the bus voltage is acquired after dividing a detected bus voltage via a voltage division unit 2. Here, as shown in FIG. 2, the voltage division unit 2 comprises a first resistor R1 and a second resistor R2, connected in series; one end of the first resistor R1 is connected to a rectified voltage VBUS obtained after rectifying an input alternating current, and the other end of the second resistor R2 is grounded. A connecting node of the first resistor R1 and the second resistor R2 outputs the signal VTRIAC which represents bus voltage. Preferably, the rectified voltage VBUS is acquired after rectifying an input alternating voltage Vac via a rectifier bridge U1. In practical application, the voltage division unit may be integrated with the TRIAC dimmer detection circuit in one chip, or may not be integrated with the TRIAC dimmer detection circuit in one chip.

In connection with FIG. 1 and FIG. 2, in this embodiment, the TRIAC dimmer detection circuit 1 according to the present invention comprises:

a comparison circuit 10, configured to generate a first processing signal CMP10 and a second processing signal CMP20 according to the signal VTRIAC representing the bus voltage, a first reference voltage Vt1 and a second reference voltage Vt2; and a control unit 11, configured to generate and output a TRIAC dimmer detection signal according to the first processing signal CMP10 and the second processing signal CMP20, wherein the TRIAC dimmer detection signal may be a leading-edge phase-cut TRIAC dimmer detection signal LEAD or a trailing-edge phase-cut TRIAC dimmer detection signal TRAIL.

Alternatively, a first TRIAC dimmer detection signal and a second TRIAC dimmer detection signal may be generated and output simultaneously, wherein the first TRIAC dimmer detection signal is a leading-edge phase-cut TRIAC dimmer detection signal LEAD, and the second TRIAC dimmer detection signal is a trailing-edge phase-cut TRIAC dimmer detection signal TRAIL.

As shown in FIG. 2, specifically, the comparison circuit 10 comprises a first comparator CMP1 and a second comparator CMP2.

A positive input end of the first comparator CMP1 is connected to the first reference voltage Vt1, and a negative input end is connected to the signal VTRIAC representing the bus voltage, and outputs the first processing signal CMP10.

A positive input end of the second comparator CMP2 is connected to the second reference voltage Vt2, and a negative input end receives the signal VTRIAC representing the bus voltage, and outputs the second processing signal CMP20.

Specifically, the control unit 11 comprises a first control unit 111 and a second control unit 112 as shown in FIG. 1.

The first control unit 111 comprises a first delay circuit 1111 (DEL1), a first logic module 1112, a first counter 1113 (CNT1) and a second logic module 1114; the first delay circuit 1111 delays the first processing signal CMP10 to obtain a delayed first processing signal CMP10_D; the first logic module 1112 receives the delayed first processing signal CMP10_D and the second processing signal CMP20, logically processes the delayed first processing signal CMP10_D and the second processing signal CMP20, and then outputs a first logic signal to a low-level valid zero clearing end RB of the first counter 1113; a clock input end C of the first counter 1113 is connected to an output end of the second logic module 1114, and an output end is connected to an input end of the second logic module 1114; and the second logic module 1114 generates a first TRIAC dimmer detection signal according to the first processing signal CMP10, the first TRIAC dimmer detection signal is a leading-edge phase-cut TRIAC dimmer detection signal LEAD.

Specifically, the first logic module 1112 comprises a first D flip-flop DFF1, and the second logic module 1114 comprises a first OR gate OR1 and a NOT gate NOT. A trigger end C of the first D flip-flop DFF1 is connected to an output end of the first delay circuit DELL an input end D is connected to an output end of the second comparator CMP2, and an output end Q is connected to a low-level valid zero clearing end RB of the first counter CNT1; a clock input end C of the first counter CNT1 is connected to an output end of the first OR gate OR1, and an output end of the first counter CNT1 is connected to a first input end of the first OR gate OR1; an input end of the NOT gate NOT is connected to an output end of the first comparator CMP1, and an output end is connected to a second input end of the first OR gate OR1; and an output end of the first OR gate OR1 outputs a leading-edge phase-cut TRIAC dimmer detection signal LEAD.

The second control unit 112 comprises a second delay circuit 1121 (DEL2), a third logic module 1122, a second counter 1123 (CNT2) and a fourth logic module 1124; the second delay circuit 1121 delays the second processing signal CMP20 to obtain a delayed second processing signal CMP20_D; the third logic module 1122 receives the delayed second processing signal CMP20_D and the first processing signal CMP10, logically processes the delayed second processing signal CMP20_D and the first processing signal CMP10, and then outputs a second logic signal to a low-level valid zero clearing end RB of the second counter 1123; a clock input end C of the second counter 1123 is connected to an output end of the fourth logic module 1124, and an output end is connected to an input end of the fourth logic module 1124; and the fourth logic module 1124 generates a second TRIAC dimmer detection signal according to the first processing signal CMP10, the second TRIAC dimmer detection signal is a trailing-edge phase-cut TRIAC dimmer detection signal TRAIL.

Specifically, the third logic module 1122 comprises a second D flip-flop DFF2, and the fourth logic module 1124 comprises a second OR gate OR2. A trigger end C of the second D flip-flop DFF2 is connected to an output end of the second delay circuit DEL2, an input end D is connected to an output end of the first comparator CMP1, and an output end Q is connected to a low-level valid zero clearing end RB of the second counter CNT2; and a first input end of the second OR gate OR2 is connected to an output end of the second counter CNT2, a second input end is connected to an output end of the NOT gate NOT, and an output end outputs a trailing-edge phase-cut TRIAC dimmer detection signal TRAIL.

In other implementation manners, the first logic module 1112, the second logic module 1114, the third logic module 1122, and the fourth logic module 1124 may also be composed of a circuit containing a logic device, wherein the logic device comprises, but not limited to, an analog logic device and a digital logic device. Here, the analog logic device is a device for processing an analog electrical signal, which comprises, but not limited to, a comparator, an AND gate, an OR gate, etc., and the digital logic device is a device for processing a digital signal represented by a pulse signal, which comprises, but not limited to, a flip-flop (e.g., an RS flip-flop, etc.), a gate circuit, a latch, a selector, etc.

In this embodiment, the first delay circuit 1111 DEL1 is a rising edge delay unit, which delays a rising edge of the signal VTRIAC representing the bus voltage to a certain extent; and the second delay circuit 1121 DEL2 is a falling edge delay unit, which delays a falling edge of the signal VTRIAC representing the bus voltage to a certain extent. When the first counter CNT1 counts to a first preset number, the leading-edge phase-cut TRIAC dimmer detection signal LEAD is effective, such as at a high level, and the first counter CNT1 stops counting. When the second counter CNT2 counts to a second preset number, the trailing-edge phase-cut TRIAC dimmer detection signal TRAIL is effective, such as at a high level, and the second counter CNT2 stops counting. Preferably, both the first preset number and the second preset number are integers, which may be the same or may be different. Preferably, they are integers of 8 to 32.

When the leading-edge phase-cut TRIAC dimmer detection signal LEAD is not effective, such as at a low level, and the trailing-edge phase-cut TRIAC dimmer detection signal TRAIL is also not effective, such as at a low level, it is indicated that no TRIAC dimmer is connected.

In this embodiment, the second reference voltage Vt2 is smaller than R2/(R1+R2)*sqrt(2)*Vac*sin(θmax), where R1 and R2 are a resistance value of the first resistor and a resistance value of the second resistor, respectively, Vac is an input alternating voltage, and θmax is a maximum turn-on angle of a TRIAC dimmer. The first reference voltage is smaller than the second reference voltage. It is recommended that the first reference voltage be one half of the second reference voltage.

In an embodiment of the present invention, the first delay circuit 1111 DEL1_ and the second delay circuit 1121 DEL2 have the same delay duration, which is: (arcsin(Vt2*(R1+R2)/R2/sqrt(2)/Vac)−arcsin(Vt1*(R1+R2)/R2/sqrt(2)/Vac))/2, where R1 and R2 are a resistance value of the first resistor and a resistance value of the second resistor, respectively, Vac is an input alternating voltage, and Vt1 and Vt2 are a first reference voltage and a second reference voltage, respectively. Meanwhile, a delay duration of the first delay circuit 1111 DEL1 and a delay duration of the second delay circuit 1121 DEL2 are smaller than a duration in which the signal VTRIAC representing the bus voltage rises from the first reference voltage Vt1 to the second reference voltage Vt2 in the absence of a TRIAC dimmer, and are smaller than a duration in which the signal VTRIAC representing the bus voltage falls from the second reference voltage Vt2 to the first reference voltage Vt1 in the absence of a TRIAC dimmer.

Figure 3:
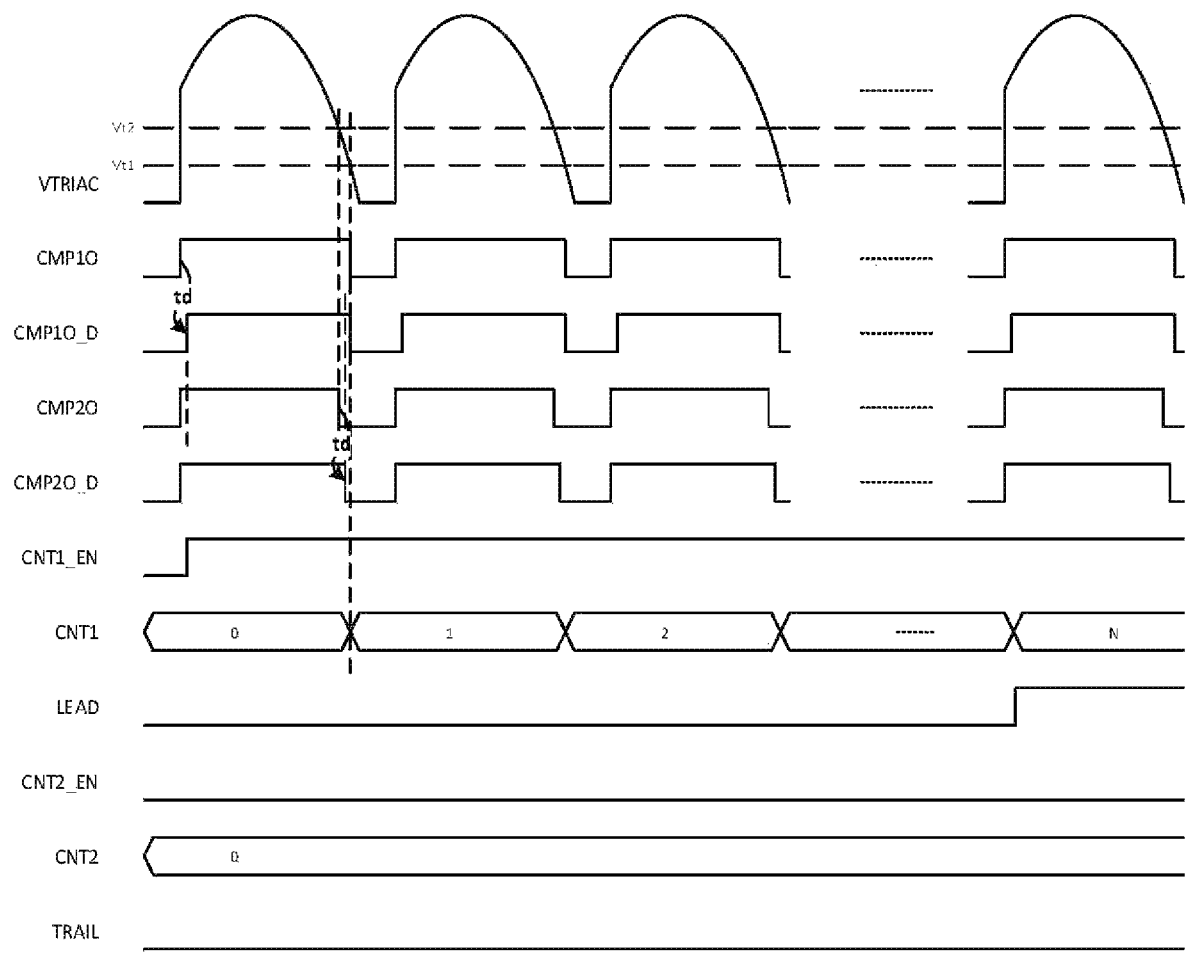
FIG. 3 is a schematic waveform diagram of each node of a TRIAC dimmer detection circuit according to the present invention when connected to a leading-edge phase-cut TRIAC dimmer.

When the TRIAC dimmer detection circuit according to the present invention is connected to a leading-edge phase-cut TRIAC dimmer, each node waveform is shown in FIG. 3. A signal VTRIAC representing the bus voltage is compared with a first reference voltage Vt1 and a second reference voltage Vt2 separately. After a rising edge of a first processing signal CMP10 is delayed for td, a second processing signal CMP20 is sampled. If a high level is sampled, it is considered that a rising edge of VTRIAC is detected, and a first counter CNT1 will be started. If a rising edge of VTRIAC is detected within N1 (N1 is the foregoing first preset number) successive cycle of the rectified voltage VBUS, it is considered that the system is connected to a leading-edge phase-cut TRIAC dimmer, a LEAD signal rises, and the first counter CNT1 will stop counting.

Figure 4:
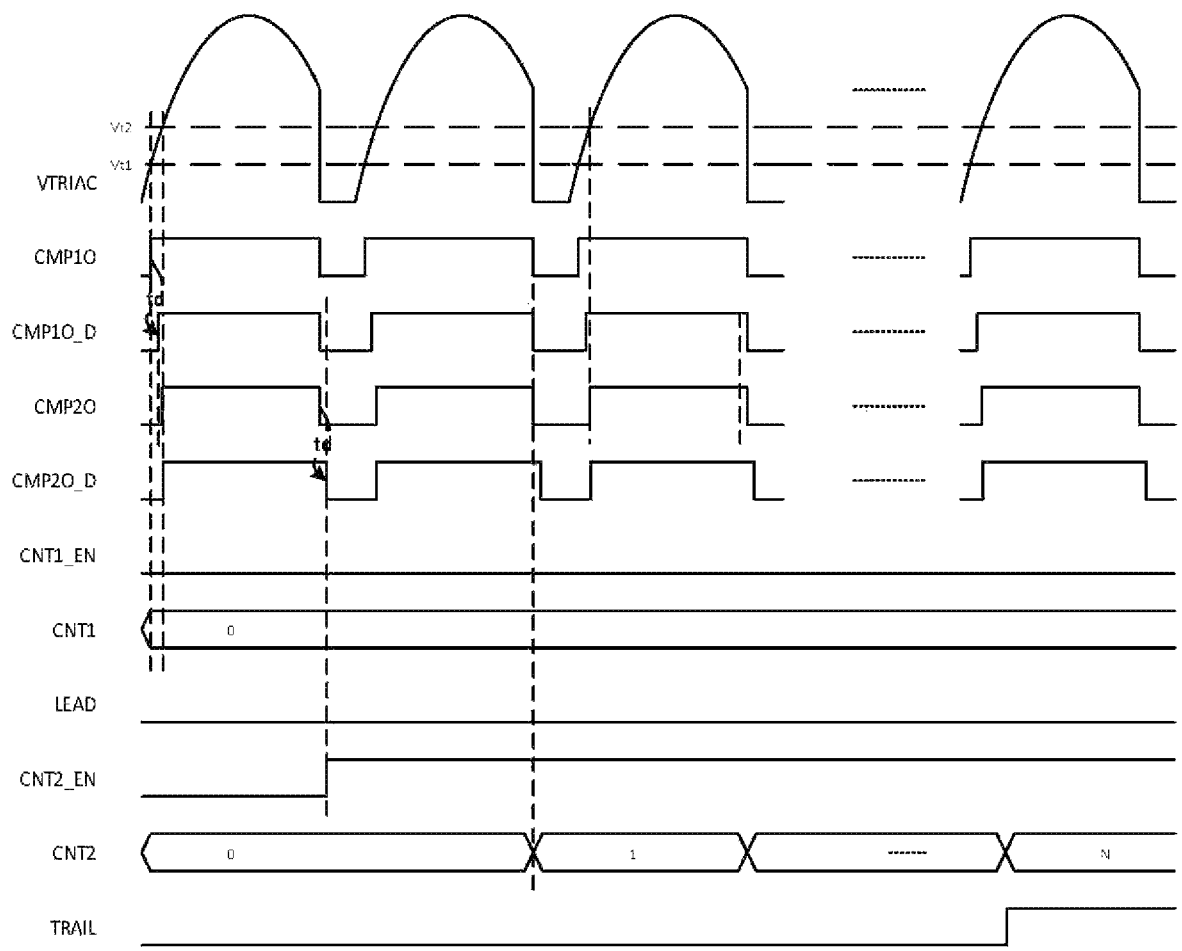
FIG. 4 is a schematic waveform diagram of each node of a TRIAC dimmer detection circuit according to the present invention when connected to a trailing-edge phase-cut TRIAC dimmer.

When the TRIAC dimmer detection circuit according to the present invention is connected to a trailing-edge phase-cut TRIAC dimmer, each node waveform is shown in FIG. 4. A signal VTRIAC representing the bus voltage is compared with a first reference voltage Vt1 and a second reference voltage Vt2 separately. After a falling edge of a second processing signal CMP20 is delayed for td, a first processing signal CMP10 is sampled. If a low level is sampled, it is considered that a falling edge of VTRIAC is detected, and a second counter CNT2 will be started. If a falling edge of VTRIAC is detected within N2 (N2 is the foregoing second preset number) successive cycle of the rectified voltage VBUS, it is considered that the system is connected to a trailing-edge phase-cut TRIAC dimmer, a TRAIL signal rises, and the second counter CNT2 will stop counting.

Figure 5:
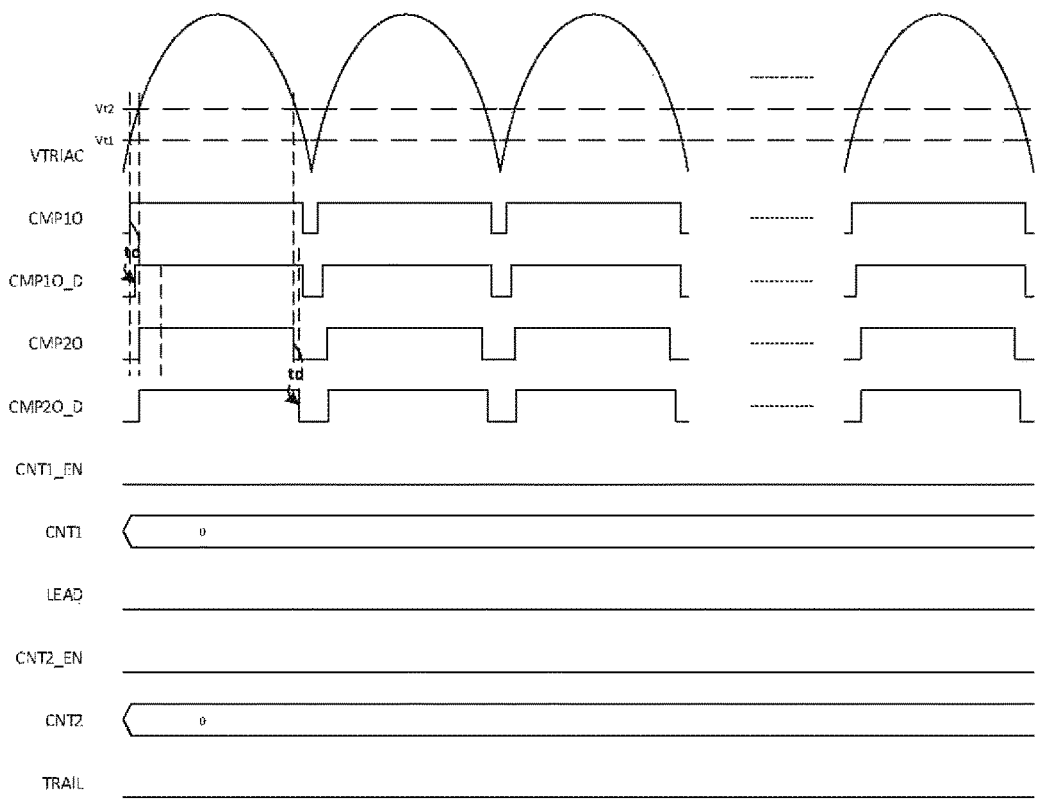
FIG. 5 is a schematic waveform diagram of each node of a TRIAC dimmer detection circuit according to the present invention when not connected to a TRIAC dimmer.

When the TRIAC dimmer detection circuit according to the present invention is not connected to a TRIAC dimmer, each node waveform is shown in FIG. 5. A signal VTRIAC representing the bus voltage is compared with a first reference voltage Vt1 and a second reference voltage Vt2 separately. A rising edge or falling edge of VTRIAC cannot be detected, and therefore both a LEAD signal and a TRAIL signal are maintained not effective, such as at a low level.

Figure 6:
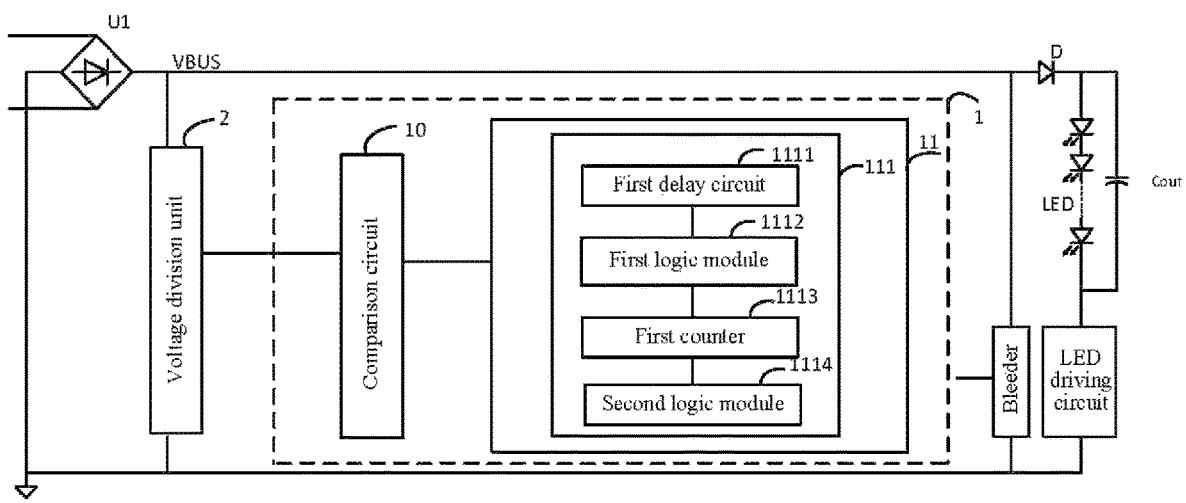
FIG. 6 is a schematic structure diagram of a TRIAC dimmer detection circuit according to another embodiment in the present invention.

As shown in FIG. 6, in this embodiment, the TRIAC dimmer detection circuit 1 can detect a signal representing the bus voltage and can generate and output a TRIAC dimmer detection signal, the TRIAC dimmer detection signal is a leading-edge phase-cut TRIAC dimmer detection signal. The signal representing the bus voltage is acquired after dividing a detected bus voltage via a voltage division unit 2. Here, the voltage division unit 2 comprises a first resistor R1 and a second resistor R2, connected in series; one end of the first resistor R1 is connected to a rectified voltage VBUS obtained after rectifying an input alternating current, and the other end of the second resistor R2 is grounded; and a connecting point between the first resistor R1 and the second resistor R2 outputs the signal VTRIAC representing the bus voltage. Preferably, the rectified voltage VBUS is acquired after rectifying an input alternating current via a rectifier bridge U1.

In this embodiment, the TRIAC dimmer detection circuit 1 according to the present invention comprises:

a comparison circuit 10, configured to generate a first processing signal CMP10 and a second processing signal CMP20 according to the signal VTRIAC representing the bus voltage, the first reference voltage Vt1, and the second reference voltage Vt2; and a control unit 11, configured to generate a leading-edge phase-cut TRIAC dimmer detection signal LEAD according to the first processing signal CMP10 and the second processing signal CMP20.

Figure 7:
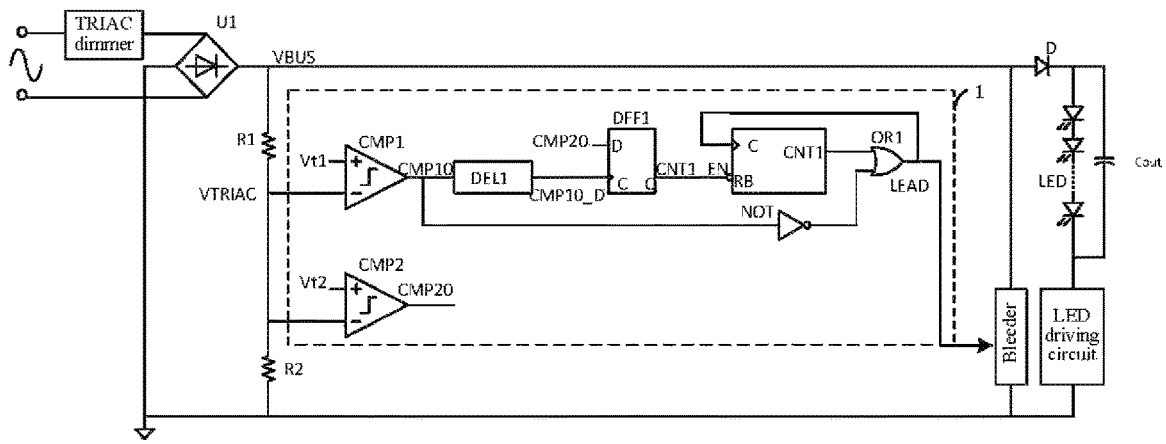
FIG. 7 is a schematic circuit diagram of a TRIAC dimmer detection circuit according to another embodiment in the present invention.

As shown in FIG. 7, specifically, the comparison circuit 10 comprises a first comparator CMP1 and a second comparator CMP2.

A positive input end of the first comparator CMP1 is connected to the first reference voltage Vt1, and a negative input end is connected to the signal VTRIAC representing the bus voltage, and outputs the first processing signal CMP10.

A positive input end of the second comparator CMP2 is connected to the second reference voltage Vt2, and a negative input end receives the signal VTRIAC representing the bus voltage, and outputs the second processing signal CMP20.

Specifically, the control unit 11 comprises a first control unit 111.

The first control unit 111 comprises a first delay circuit 1111 (DEL1), a first logic module 1112, a first counter 1113 (CNT1) and a second logic module 1114; the first delay circuit 1111 delays the first processing signal CMP10 to obtain a delayed first processing signal CMP10_D; the first logic module 1112 receives the delayed first processing signal CMP10_D and the second processing signal CMP20, logically processes the signals, and then outputs the signals to a low-level valid zero clearing end RB of the first counter 1113; a clock input end C of the first counter 1113 is connected to an output end of the second logic module 1114, and an output end is connected to an input end of the second logic module 1114; and the second logic module 1114 generates a TRIAC dimmer detection signal according to the first processing signal CMP10, the TRIAC dimmer detection signal is a leading-edge phase-cut TRIAC dimmer detection signal LEAD.

Specifically, the first logic module 1112 comprises a first D flip-flop DFF1, and the second logic module 1114 comprises a first OR gate OR1 and a NOT gate NOT. A trigger end C of the first D flip-flop DFF1 is connected to an output end of the first delay circuit DEL1 an input end D is connected to an output end of the second comparator CMP2, and an output end Q is connected to a low-level valid zero clearing end RB of the first counter CNT1; a clock input end C of the first counter CNT1 is connected to an output end of the first OR gate OR1, and an output end of the first counter CNT1 is connected to a first input end of the first OR gate OR1; an input end of the NOT gate NOT is connected to an output end of the first comparator CMP1, and an output end is connected to a second input end of the first OR gate OR1; and an output end of the first OR gate OR1 outputs a leading-edge phase-cut TRIAC dimmer detection signal LEAD.

In other implementation manners, the first logic module 1112 and the second logic module 1114 may also be composed of a circuit containing a logic device, wherein the logic device comprises, but not limited to, an analog logic device and a digital logic device. Here, the analog logic device is a device for processing an analog electrical signal, which comprises, but not limited to, a comparator, an AND gate, an OR gate, etc.; and the digital logic device is a device for processing a digital signal represented by a pulse signal, which comprises, but not limited to, a flip-flop (e.g., an RS flip-flop, etc.), a gate circuit, a latch, a selector, etc.

In this embodiment, the principles of the comparison circuit and the control unit are the same as those of the embodiments in FIG. 1 and FIG. 2, so they will not be described again herein.

Figure 8:
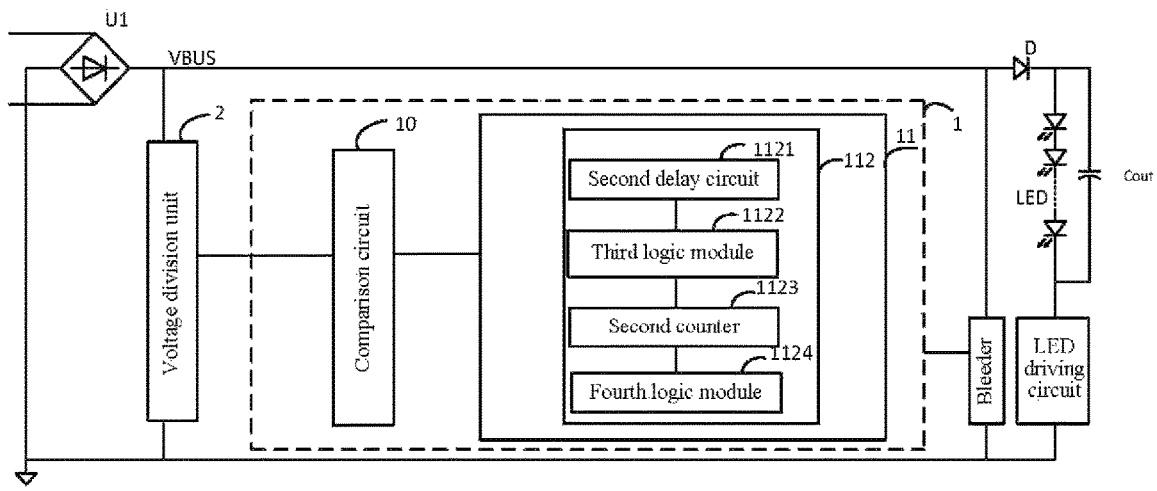
FIG. 8 is a schematic structure diagram of a TRIAC dimmer detection circuit according to another embodiment in the present invention.

As shown in FIG. 8, in this embodiment, the TRIAC dimmer detection circuit 1 can detect a signal representing the bus voltage and can generate and output a TRIAC dimmer detection signal, the TRIAC dimmer detection signal is a trailing-edge phase-cut TRIAC dimmer detection signal. The signal representing the bus voltage is acquired after dividing a detected bus voltage via a voltage division unit. Here, the voltage division unit 2 comprises a first resistor R1 and a second resistor R2, connected in series; one end of the first resistor R1 is connected to a rectified voltage VBUS obtained after rectifying an input alternating current, and the other end of the second resistor R2 is grounded; and a connecting point between the first resistor R1 and the second resistor R2 outputs the bus voltage reflecting signal VTRIAC. Preferably, the rectified voltage VBUS is acquired after rectifying an input alternating current via a rectifier bridge U1.

Figure 9:
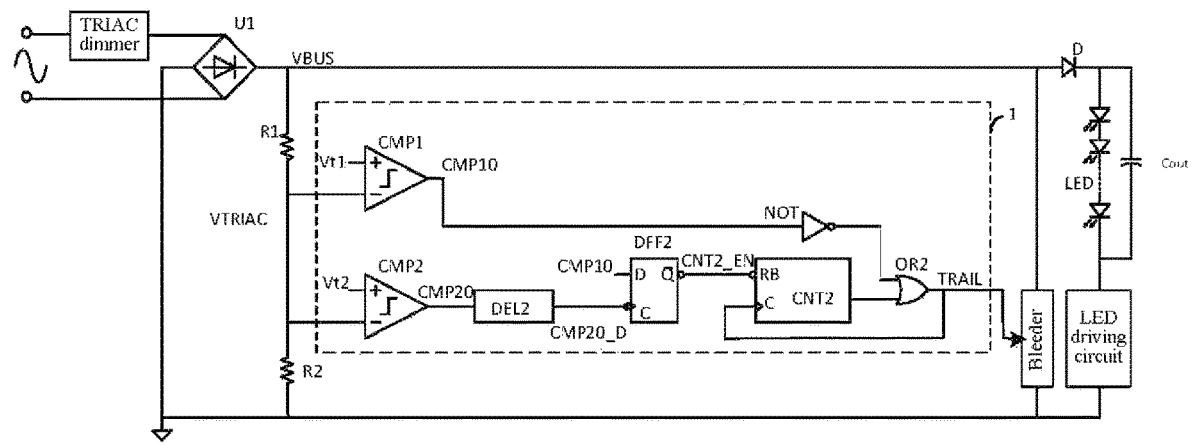
FIG. 9 is a schematic circuit diagram of a TRIAC dimmer detection circuit according to another embodiment in the present invention.

As shown in FIG. 9, in this embodiment, the TRIAC dimmer detection circuit 1 according to the present invention comprises:

a comparison circuit 10, configured to generate a first processing signal CMP10 and a second processing signal CMP20 according to the signal VTRIAC representing the bus voltage, the first reference voltage Vt1 and the second reference voltage Vt2; and a control unit 11, configured to generate a trailing-edge phase-cut TRIAC dimmer detection signal TRAIL according to the first processing signal CMP10 and the second processing signal CMP20.

As shown in FIG. 9, specifically, the comparison circuit 10 comprises a first comparator CMP1 and a second comparator CMP2.

A positive input end of the first comparator CMP1 is connected to the first reference voltage Vt1, and a negative input end is connected to the signal VTRIAC representing the bus voltage, and outputs the first processing signal CMP10.

A positive input end of the second comparator CMP2 is connected to the second reference voltage Vt2, and a negative input end receives the signal VTRIAC representing the bus voltage, and outputs the second processing signal CMP20.

Specifically, the control unit 11 comprises a second control unit 112.

The second control unit 112 comprises a second delay circuit 1121 (DEL2), a third logic module 1122, a second counter 1123 (CNT2) and a fourth logic module 1124; the second delay circuit 1121 delays the second processing signal CMP20 to obtain a delayed second processing signal CMP20_D; the third logic module 1122 receives the delayed second processing signal CMP20_D and the first processing signal CMP10, logically processes the signals, and then outputs the signals to a low-level valid zero clearing end RB of the second counter 1123; a clock input end C of the second counter 1123 is connected to an output end of the fourth logic module 1124, and an output end is connected to an input end of the fourth logic module 1124; and the fourth logic module 1124 generates a TRIAC dimmer detection signal according to the first processing signal CMP10, the TRIAC dimmer detection signal is a trailing-edge phase-cut TRIAC dimmer detection signal TRAIL.

Specifically, the third logic module 1122 comprises a second D flip-flop DFF2, and the fourth logic module 1124 comprises a second OR gate OR2 and a NOT gate NOT. A trigger end C of the second D flip-flop DFF2 is connected to an output end of the second delay circuit DEL2, an input end D is connected to an output end of the first comparator CMP1, and an output end Q is connected to a low-level valid zero clearing end RB of the second counter CNT2; and a first input end of the second OR gate OR2 is connected to an output end of the second counter CNT2, a second input end is connected to an output end of the NOT gate NOT, and an output end of the second OR gate OR2 outputs a trailing-edge phase-cut TRIAC dimmer detection signal TRAIL.

In other implementation manners, the third logic module 1122 and the fourth logic module 1124 may also be composed of a circuit containing a logic device, wherein the logic device comprises, but not limited to, an analog logic device and a digital logic device. Here, the analog logic device is a device for processing an analog electrical signal, which comprises, but not limited to, a comparator, an AND gate, an OR gate, etc., and the digital logic device is a device for processing a digital signal represented by a pulse signal, which comprises, but not limited to, a flip-flop (e.g., an RS flip-flop, etc.), a gate circuit, a latch, a selector, etc.

In this embodiment, the principles of the comparison circuit and the control unit are the same as those of the embodiments in FIG. 1 and FIG. 2, so they will not be described again herein.

Figure 10:
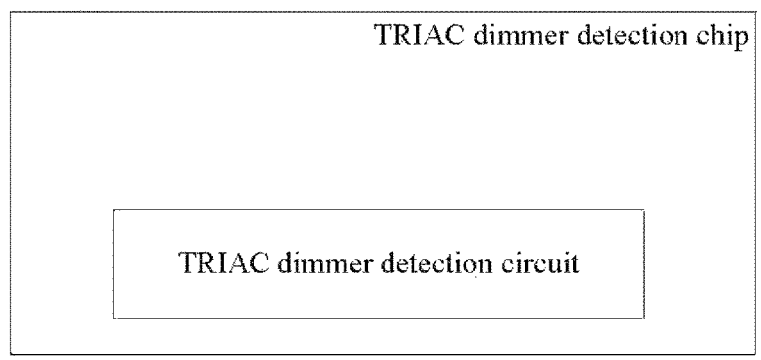
FIG. 10 is a schematic structure diagram of a TRIAC dimmer detection chip according to another embodiment in the present invention.

As shown in FIG. 10, in an embodiment, the TRIAC dimmer detection chip according to the present invention comprises a foregoing TRIAC dimmer detection circuit.

Figure 11:
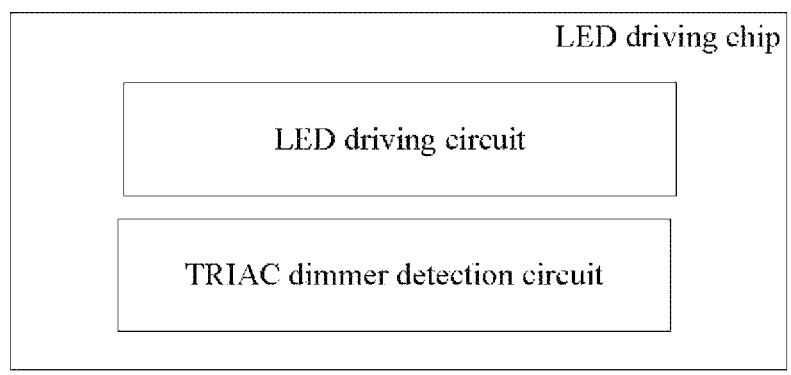
FIG. 11 is a schematic structure diagram of an LED driving chip according to another embodiment in the present invention.

As shown in FIG. 11, in an embodiment, the LED driving chip according to the present invention comprises a foregoing TRIAC dimmer detection circuit and LED driving circuit.

As shown in FIG. 2, FIG. 7, and FIG. 9, in an embodiment, the LED driving system according to the present invention comprises:

a rectification unit U1, configured to rectify an input alternating current and then output the rectified voltage to an LED load;

an energy storage unit Cout, connected to an input end and an output end of the LED load;

an LED driving circuit, configured to provide current for the LED load;

a foregoing TRIAC dimmer detection circuit, configured to generate a TRIAC dimmer detection signal according to a signal representing the bus voltage; and a bleeder, configured to make a turn-on or turn-off response according to the dimmer detection signal, wherein when a current of the LED driving circuit is smaller than a minimum current for maintaining an on state of a TRIAC dimmer, the bleeder adjusts a working mode thereof according to the dimmer detection signal, and provides an extra current to maintain the on state of the TRIAC dimmer.

Specifically, when the bleeder detects that the leading-edge phase-cut TRIAC dimmer detection signal is not effective, such as at a low level, and the trailing-edge phase-cut TRIAC dimmer detection signal is also not effective, such as at a low level, the bleeder is completely shut down; and when it is detected that the leading-edge phase-cut TRIAC dimmer detection signal is effective or the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always on.

Specifically, when the control unit of the TRIAC dimmer detection circuit comprises a first control unit, if the bleeder detects that the TRIAC dimmer detection signal is a leading-edge phase-cut TRIAC dimmer detection signal and is at a low level, the bleeder is completely closed; and when it is detected that the leading-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always on.

Specifically, when the control unit of the TRIAC dimmer detection circuit comprises a second control unit, if the bleeder detects that the TRIAC dimmer detection signal is a trailing-edge phase-cut TRIAC dimmer detection signal and is not effective, such as at a low level, the bleeder is completely shut down; and when it is detected that the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a first control unit and a second control unit, if the bleeder detects that the TRIAC dimmer detection signal comprises a leading-edge phase-cut TRIAC dimmer detection signal and a trailing-edge phase-cut TRIAC dimmer detection signal and both the leading-edge phase-cut TRIAC dimmer detection signal and the trailing-edge phase-cut TRIAC dimmer detection signal are not effective, such as at a low level, the bleeder is completely shut down; and when it is detected that the leading-edge phase-cut TRIAC dimmer detection signal is effective, such as at a high level, or the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

In another embodiment, the LED driving system according to the present invention comprises:

a rectification unit U1, configured to rectify an input alternating current and then output it to an LED load;

an energy storage unit Cout, connected to an input end and an output end of the LED load;

a foregoing LED driving chip, configured to provide current for the LED load, and generate a TRIAC dimmer detection signal (a leading-edge phase-cut TRIAC dimmer detection signal and/or a trailing-edge phase-cut TRIAC dimmer detection signal) according to a signal representing the bus voltage; and a bleeder, configured to make a turn-on or turn-off response according to the dimmer detection signal, wherein when a current of the LED driving circuit is smaller than a minimum current for maintaining an on state of a TRIAC dimmer, the bleeder adjusts a working mode thereof according to the dimmer detection signal, and provides an extra current to maintain the on state of the TRIAC dimmer.

Specifically, when the bleeder detects that the leading-edge phase-cut TRIAC dimmer detection signal is not effective, such as at a low level and the trailing-edge phase-cut TRIAC dimmer detection signal is also not effective, such as at a low level, the bleeder is completely shut down; and when it is detected that the leading-edge phase-cut TRIAC dimmer detection signal is effective, such as at a high level, or the trailing-edge phase-cut TRIAC dimmer detection signal is not effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a first control unit, if the bleeder detects that the TRIAC dimmer detection signal is a leading-edge phase-cut TRIAC dimmer detection signal and is not effective, such as at a low level, the bleeder is completely shut down; and when it is detected that the leading-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a second control unit, if the bleeder detects that the TRIAC dimmer detection signal is a trailing-edge phase-cut TRIAC dimmer detection signal and is not effective, such as at a low level, the bleeder is completely closed; and when it is detected that the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a first control unit and a second control unit, if the bleeder detects that the TRIAC dimmer detection signal comprises a leading-edge phase-cut TRIAC dimmer detection signal and a trailing-edge phase-cut TRIAC dimmer detection signal and both the leading-edge phase-cut TRIAC dimmer detection signal and the trailing-edge phase-cut TRIAC dimmer detection signal are not effective, such as at a low level, the bleeder is completely shut down; and when it is detected that the leading-edge phase-cut TRIAC dimmer detection signal is at a high level or the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

In a third embodiment, the LED driving system according to the present invention comprises:

a rectification unit U1, configured to rectify an external alternating current and then output it to an LED load;

an energy storage unit Cout, connected to an input end and an output end of the LED load;

an LED driving circuit, configured to provide current for the LED load;

a foregoing TRIAC dimmer detection chip, configured to generate a TRIAC dimmer detection signal (leading-edge phase-cut TRIAC dimmer detection signal and/or a trailing-edge phase-cut TRIAC dimmer detection signal) according to a signal representing bus voltage; and a bleeder, configured to make a turn-on or turn-off response according to the dimmer detection signal, wherein when a current of the LED driving circuit is smaller than a minimum current for maintaining an on state of a TRIAC dimmer, the bleeder adjusts a working mode thereof according to the dimmer detection signal, and provides an extra current to maintain the on state of the TRIAC dimmer.

Specifically, when the bleeder detects that the leading-edge phase-cut TRIAC dimmer detection signal is at a low level and the trailing-edge phase-cut TRIAC dimmer detection signal is also at a low level, the bleeder is completely closed; and when it is detected that the leading-edge phase-cut TRIAC dimmer detection signal is at a high level or the trailing-edge phase-cut TRIAC dimmer detection signal is at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a first control unit, if the bleeder detects that the TRIAC dimmer detection signal is a leading-edge phase-cut TRIAC dimmer detection signal and is not effective, such as at a low level, the bleeder is completely shut down; and when it is detected that the leading-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a second control unit, if the bleeder detects that the TRIAC dimmer detection signal is a trailing-edge phase-cut TRIAC dimmer detection signal and is not effective, such as at a low level, the bleeder is completely closed; and when it is detected that the trailing-edge phase-cut TRIAC dimmer detection signal is effective, such as at a high level, the bleeder adopts a corresponding working mode according to the type of a TRIAC dimmer, i.e., is turned on for part of the time, so as to ensure that the TRIAC dimmer is always in an on state.

Specifically, when the control unit of the TRIAC dimmer detection circuit comprises a first control unit and a second control unit, if the bleeder detects that the TRIAC dimmer detection signal comprises a leading-edge phase-cut TRIAC dimmer detection signal and a trailing-edge phase-cut TRIAC dimmer detection signal and both the leading-edge phase-cut TRIAC dimmer detection signal and the trailing-edge phase-cut TRIAC dimmer detection signal are not effective, such as at a low level, the bleeder is completely shut down; and when it is detected that the leading-edge phase-cut TRIAC dimmer detection signal is at a high level or the trailing-edge phase-cut TRIAC dimmer detection signal are effective, such as at a high level, the bleeder adopts a corresponding working mode according to the type of a TRIAC dimmer, i.e., is turned on for part of the time, so as to ensure that the TRIAC dimmer is always in an on state.

Figure 12:
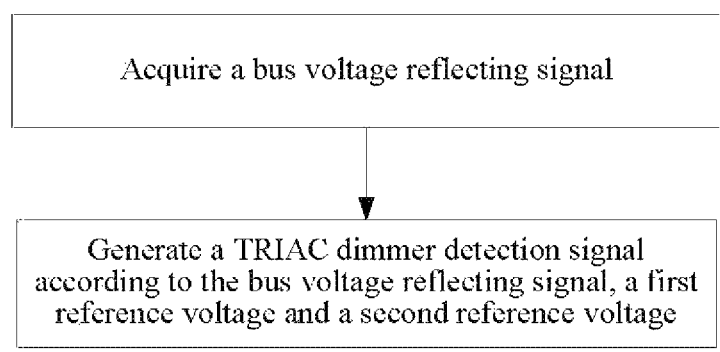
FIG. 12 is a flowchart of a TRIAC dimmer detection method according to an embodiment in the present invention in an embodiment.

As shown in FIG. 12, the present invention provides a TRIAC dimmer detection method, comprising the following steps:

Step 1: Acquire a signal representing the bus voltage.

As shown in FIG. 1, in this embodiment, the signal VTRIAC representing the bus voltage is acquired after dividing a detected bus voltage via a voltage division unit. Specifically, one end of a first resistor R1 and a second resistor R2, connected in series, is connected to a rectified voltage VBUS obtained after rectifying an input alternating current Vac, and the other end is grounded; and a connecting point between the first resistor R1 and the second resistor R2 outputs the signal VTRIAC representing the bus voltage. Here, the second resistor R2 is close to the grounded end.

Step 2: Generate a TRIAC dimmer detection signal according to the signal VTRIAC representing the bus voltage, a first reference voltage, and a second reference voltage.

In an embodiment of the present invention, step 2 comprises:

generating a first processing signal CMP10 according to the signal VTRIAC representing the bus voltage and the first reference voltage Vt1, and delaying the first processing signal CMP10 to generate a delayed first processing signal CMP10_D; and generating a second processing signal CMP20 according to the signal VTRIAC representing the bus voltage and the second reference voltage Vt2.

and generating a TRIAC dimmer detection signal according to the first processing signal CMP10, the second processing signal CMP20 and the delayed first processing signal CMP10_D, the TRIAC dimmer detection signal is a leading-edge phase-cut TRIAC dimmer detection signal LEAD.

In an embodiment of the present invention, step 2 comprises:

generating a first processing signal CMP10 according to the signal VTRIAC representing the bus voltage and the first reference voltage Vt1; and generating a second processing signal CMP20 according to the signal VTRIAC representing the bus voltage and the second reference voltage Vt2, and delaying the second processing signal to generate a delayed second processing signal CMP20_D.

and generating a TRIAC dimmer detection signal according to the first processing signal CMP10, the second processing signal CMP20 and the delayed second processing signal CMP20_D, the TRIAC dimmer detection signal is a trailing-edge phase-cut TRIAC dimmer detection signal TRAIL.

In an embodiment of the present invention, step 2 comprises:

generating a first processing signal CMP10 according to the signal VTRIAC representing the bus voltage and the first reference voltage Vt1, and delaying the first processing signal CMP10 to generate a delayed first processing signal CMP10_D; generating a second processing signal CMP20 according to the signal VTRIAC representing the bus voltage reflecting and the second reference voltage Vt2, and delaying the second processing signal to generate a delayed second processing signal CMP20_D;

generating a first TRIAC dimmer detection signal according to the first processing signal CMP10, the second processing signal CMP20 and the delayed first processing signal CMP10_D, the first TRIAC dimmer detection signal is a leading-edge phase-cut TRIAC dimmer detection signal LEAD; and generating a second TRIAC dimmer detection signal according to the first processing signal CMP10, the second processing signal CMP20 and the delayed second processing signal CMP20_D, the second TRIAC dimmer detection signal is a trailing-edge phase-cut TRIAC dimmer detection signal TRAIL.

Specifically, a rising edge of the delayed first processing signal CMP10_D is counted. When a first preset number is counted, a leading-edge phase-cut TRIAC dimmer detection signal LEAD is output, and counting is stopped, the leading-edge phase-cut TRIAC dimmer detection signal LEAD will be effective.

A falling edge of the delayed second processing signal CMP20_D is counted. When a second preset number is counted, a trailing-edge phase-cut TRIAC dimmer detection signal TRAIL is output, and counting is stopped, the trailing-edge phase-cut TRIAC dimmer detection signal TRAIL will be effective.

In an embodiment of the present invention, the first preset number and the second preset number are integers, which may be the same or may be different. Preferably, they are integers of 8 to 32.

In an embodiment of the present invention, the second reference voltage Vt2 is smaller than $R2/(R1+R2)*\sqrt{2}*Vac*\sin(\theta max)$, where R1 and R2 are a resistance value of the first resistor and a resistance value of the second resistor, respectively, Vac is an input alternating voltage, θmax is a maximum turn-on angle of a TRIAC dimmer, and R2 is close to a grounded end. The first reference voltage Vt1 is smaller than the second reference voltage Vt2.

In an embodiment of the present invention, the first processing signal CMP10 and the second processing signal CMP20 have the same delay duration, which is: $(\arcsin(Vt2*(R1+R2)/R2/\sqrt{2}/Vac)-\arcsin(Vt1*(R1+R2)/R2/\sqrt{2}/Vac))/2$,
where R1 and R2 are a resistance value of the first resistor and a resistance value of the second resistor, respectively, Vac is an input alternating voltage, Vt1 and Vt2 are a first reference voltage and a second reference voltage, respectively, and R2 is close to a grounded end. Meanwhile, a delay duration of the first processing signal CMP10 and a delay duration of the second processing signal CMP20 are smaller than a duration in which the signal VTRIAC representing the bus voltage rises from the first reference voltage Vt1 to the second reference voltage Vt2 in the absence of a TRIAC dimmer, and are smaller than a duration in which the signal VTRIAC representing the bus voltage falls from the second reference voltage Vt2 to the first reference voltage Vt1 in the absence of a TRIAC dimmer.

To sum up, the TRIAC dimmer detection circuit, chip and method, and the LED driving chip and system according to the present invention can detect whether a TRIAC dimmer is contained in an LED illuminating system, so as to determine a working state of a bleeder. When it is detected that there is no TRIAC dimmer, the bleeder is completely closed, and when it is detected that there is a TRIAC dimmer, the bleeder adopts a corresponding working mode according to the type of the TRIAC dimmer, thereby reducing the power consumption of the bleeder, and improving the efficiency of the LED illuminating system. Therefore, the present invention effectively overcomes various disadvantages in the prior art and has a high industrial utilization value.

The above embodiments merely illustrate the principle and effects of the present invention, but are not to limit the present invention. Any person skilled in the art can modify or vary the above embodiments without departing from the spirit and scope of the present invention. Accordingly, all equivalent modifications or variations completed by those of ordinary skill in the art without departing from the spirit and technical thought disclosed in the present invention should still be covered by the claims of the present invention.

What is claimed is:

1. A dimmer detection circuit comprising:
   a sampling unit, coupled to output of a rectifier and configured to output a signal representing a bus voltage;
   a first comparator coupled to the sampling unit and configured to receive a first reference voltage and the signal, and generate a first processing signal;
   a second comparator coupled to the sampling unit and configured to receive a second reference voltage and the signal, and generate a second processing signal; and
   a control unit configured to receive the first processing signal and the second processing signal to detect the slope of the bus voltage change from the first reference voltage to the second reference voltage; wherein
   the control unit outputs a dimmer detection result which indicates a leading edge phase cut or a trailing edge phase cut dimmer is present or neither by detects falling edge or rising edge of the first processing signal and the second processing signal.

2. The dimmer detection circuit according to claim 1, wherein the sampling unit is a voltage division unit.

3. The dimmer detection circuit as in claim 2, wherein the voltage division unit comprises a first resistor and a second resistor, connected in series; one end of the first resistor is connected to a rectified voltage obtained after rectifying an input alternating current, and the other end of the second resistor is grounded; and a connecting node between the first resistor and the second resistor outputs the signal representing the bus voltage.

4. The dimmer detection circuit as in claim 3, wherein the second reference voltage is smaller than $R2/(R1+R2)*\sqrt{2}*Vac*\sin(\theta max)$, where R1 and R2 are a resistance value of the first resistor and a resistance value of the second resistor, respectively, Vac is an input alternating voltage, θmax is a maximum turn-on angle of a dimmer.

5. The dimmer detection circuit according to claim 4, wherein the first reference voltage is smaller than the second reference voltage.

6. The dimmer detection circuit as in claim 3, wherein a first delay circuit and a second delay circuit have the same delay duration, which is equal to $(\arcsin(Vt2*(R1+R2)/R2/\sqrt{2}/Vac)-\arcsin(Vt1*(R1+R2)/R2/\sqrt{2}/Vac))/2$, where R1 and R2 are a resistance value of the first resistor and a resistance value of the second resistor, respectively, Vac is an input alternating voltage, Vt1 and Vt2 are a first reference voltage and a second reference voltage, respectively.

7. The dimmer detection circuit according to claim 1, wherein:
   the control unit comprise a first delay circuit and a second delay circuit;
   the first delay circuit delays the rising or falling edge of the first processing signal for a predetermined time and outputs a delayed first processing signal; and
   the second delay circuit delays the falling or rising edge of the second processing signal for the predetermined time and outputs a delayed second processing signal.

8. The dimmer detection circuit according to claim 7, wherein the control unit further comprises;
   a first logic module, a first counter and a second logic module; the first logic module receives the delayed first processing signal and the second processing signal, logically processes the delayed first processing signal and the second processing signal, and then outputs a first logic signal to a reset end of the first counter; a clock input end of the first counter is connected to an output end of the second logic module, and an output end of the first counter is connected to an input end of the second logic module; and the second logic module generates a dimmer detection signal which indicates whether a leading-edge phase-cut dimmer is present or not.

9. The dimmer detection circuit according to claim 8, wherein the first logic module comprises a first D flip-flop, and the second logic module comprises a first OR gate and a NOT gate;
   a trigger end C of the first D flip-flop is connected to an output end of the first delay circuit, an input end D is connected to an output end of the second comparator, and an output end Q is connected to a reset end of the first counter; an output end of the first counter is connected to a first input end of the first OR gate; an input end of the NOT gate is connected to an output end of the first comparator, and an output end is connected to a second input end of the first OR gate; and an output end of the first OR gate outputs the dimmer detection signal.

10. The dimmer detection circuit according to claim 8, wherein when the first counter counts to a first preset number, the leading-edge phase-cut dimmer detection signal is effective, and counting is stopped.

11. The dimmer detection circuit according to claim 7, wherein the control unit further comprises
   a third logic module, a second counter, and a fourth logic module;
   the third logic module receives the delayed second processing signal and the first processing signal, logically processes the delayed second processing signal and the first processing signal, and then outputs the second logic signals to a reset end of the second counter; a clock input end of the second counter is connected to an output end of the fourth logic module, and an output end of the second counter is connected to an input end of the fourth logic module; and the fourth logic module generates a dimmer detection signal which indicates whether a trailing-edge phase-cut dimmer is present or not.

12. The dimmer detection circuit according to claim 11, wherein the third logic module comprises a second D flip-flop, and the fourth logic module comprises a second OR gate and a NOT gate;
   a trigger end C of the second D flip-flop is connected to an output end of the second delay circuit, an input end D is connected to an output end of the first comparator, and an output end Q is connected to a reset end of the second counter; an input end of the NOT gate is connected to an output end of the first comparator; and a first input end of the second OR gate is connected to an output end of the second counter, a second input end is connected to an output end of the NOT gate, and an output end outputs the dimmer detection signal.

13. The dimmer detection circuit according to claim 11, wherein when the second counter counts to a second preset number, the trailing-edge phase-cut dimmer detection signal is effective, and counting is stopped.

14. The dimmer detection circuit according to claim 7, wherein the control unit comprises a first control unit and a second control unit, which output a first dimmer detection signal and a second dimmer detection signal respectively;

the first control unit comprises the first delay circuit, a first logic module, a first counter and a second logic module; the first logic module receives the delayed first processing signal and the second processing signal, logically processes the delayed first processing signal and the second processing signal, and then outputs a first logic signals to a reset end of the first counter; a clock input end of the first counter is connected to an output end of the second logic module, and an output end is connected to an input end of the second logic module; the second logic module generates a first dimmer detection signal which indicates whether a leading-edge phase-cut dimmer is present or not;
the second control unit comprises the second delay circuit, a third logic module, a second counter and a fourth logic module;
the third logic module receives the delayed second processing signal and the first processing signal, logically processes the delayed second processing signal and the first processing signal, and then outputs a second signals to a reset end of the second counter; a clock input end of the second counter is connected to an output end of the fourth logic module, and an output end is connected to an input end of the fourth logic module; and the fourth logic module generates a second dimmer detection signal which indicates whether a trailing-edge phase-cut dimmer present or not.

15. The dimmer detection circuit according to claim 14, wherein the first logic module comprises a first D flip-flop, the second logic module comprises a first OR gate and a NOT gate, the third logic module comprises a second D flip-flop, and the fourth logic module comprises a second OR gate;
   a trigger end C of the first D flip-flop is connected to an output end of the first delay circuit, an input end D is connected to an output end of the second comparator, and an output end Q is connected to a reset end of the first counter; an output end of the first counter is connected to a first input end of the first OR gate; an input end of the NOT gate is connected to an output end of the first comparator, and an output end is connected to a second input end of the first OR gate; an output end of the first OR gate outputs the first dimmer detection signal;
   a trigger end C of the second D flip-flop is connected to an output end of the second delay circuit, an input end D is connected to an output end of the first comparator, and an output end Q is connected to a reset end of the second counter; and a first input end of the second OR gate is connected to an output end of the second counter, a second input end is connected to the output end of the NOT gate, and an output end outputs the second dimmer detection signal.

16. The dimmer detection circuit according to claim 14, wherein when the first counter counts to a first preset number, the leading-edge phase-cut dimmer detection signal is effective, and counting is stopped; or wherein when the second counter counts to a second preset number, the trailing-edge phase-cut dimmer detection signal is effective, and counting is stopped.

17. The dimmer detection circuit according to claim 14, wherein the first delay circuit is a rising edge delay unit, which delays a rising edge of the signal representing the bus voltage to a certain delay duration; and the second delay circuit is a falling edge delay unit, which delays a falling edge of the signal representing the bus voltage to a certain delay duration, wherein the delay duration are smaller than a duration in which the signal representing the bus voltage rises from the first reference voltage to the second reference voltage in the absence of a dimmer, and/or are smaller than a duration in which the reflecting signal bus voltage falls from the second reference voltage to the first reference voltage in the absence of a dimmer.

18. The dimmer detection circuit according to claim 1, wherein
a positive input end of the first comparator is connected to the first reference voltage, and a negative input end is connected to the signal representing the bus voltage, and outputs the first processing signal; and
a positive input end of the second comparator is connected to the second reference voltage, and a negative input end receives the signal representing the bus voltage, and outputs the second processing signal.

19. An LED driving system, comprising:
a rectification unit, configured to rectify an input alternating current and then output it to an LED load;
an energy storage unit, connected to an input end and an output end of the LED load;
an LED driving circuit, configured to provide current for the LED load;
a dimmer detection circuit according to claim 1, configured to generate a dimmer detection signal according to a signal representing the bus voltage; and
a bleeder, configured to act in different working modes according to the dimmer detection signal,
wherein when a current of the LED driving circuit is smaller than a minimum current for maintaining an on state of a dimmer, the bleeder turns on based on the dimmer detection signal in the indicative of the presence of a dimmer, to provide an extra current to maintain the on state of the dimmer.

20. The LED driving system according to claim 19, wherein the LED driving circuit and the dimmer detection circuit may be integrated in an LED driving chip, or the LED driving circuit may be integrated in an LED driving chip, and the dimmer detection circuit may be integrated in a dimmer detection chip.

21. A dimmer detection method, comprising the following steps:
step 1: acquiring, by a voltage division unit including a first resistance and a second resistance in series, a signal representing the bus voltage; and
step 2: generating, by a dimmer detection circuit, a dimmer detection signal according to the bus voltage reflecting signal, a first reference voltage and a second reference voltage;
wherein step 2 comprises:
generating a first processing signal according to the signal representing the bus voltage and the first reference voltage, and delaying the first processing signal; generating a second processing signal according to the signal representing the bus voltage;
generating a dimmer detection signal according to the first processing signal, the second processing signal and the delayed first processing signal, the dimmer detection signal is a leading-edge phase-cut dimmer detection signal.

22. The dimmer detection method according to claim 21, wherein step 2 comprises:
generating a first processing signal according to the signal representing the bus voltage and the first reference voltage; generating a second processing signal according to the signal representing the bus voltage and the second reference voltage, and delaying the second processing signal;
generating a dimmer detection signal according to the first processing signal, the second processing signal and the delayed second processing signal, the dimmer detection signal is a trailing-edge phase-cut dimmer detection signal.

23. The dimmer detection method according to claim 22, wherein step 2 comprises:
counting a falling edge of the delayed second processing signal, when counting to a second preset number, outputting a trailing-edge phase-cut dimmer detection signal, and stopping counting, the trailing-edge phase-cut dimmer detection signal is effective, wherein the second preset number is integers.

24. The dimmer detection method according to claim 21, wherein step 2 comprises:
generating a first processing signal according to the signal representing the bus voltage and the first reference voltage, and delaying the first processing signal; generating a second processing signal according to the signal representing the bus voltage and the second reference voltage, and delaying the second processing signal;
generating a first dimmer detection signal according to the first processing signal, the second processing signal and the delayed first processing signal, the first dimmer detection signal is a leading-edge phase-cut dimmer detection signal; or generating a second dimmer detection signal according to the first processing signal, the second processing signal and the delayed second processing signal, the second dimmer detection signal is a trailing-edge phase-cut dimmer detection signal.

25. The dimmer detection method according to claim 24, wherein step 2 comprises:
counting a rising edge of the delayed first processing signal, when counting to a first preset number, outputting a leading-edge phase-cut dimmer detection signal, and stopping counting, the leading-edge phase-cut dimmer detection signal is effective; or counting a falling edge of the delayed second processing signal, when counting to a second preset number, outputting a trailing-edge phase-cut dimmer detection signal, and stopping counting, the trailing-edge phase-cut dimmer detection signal is effective, wherein the first preset number and the second preset number are integers.

26. The dimmer detection method according to claim 24, wherein the first processing signal and the second processing signal have the same delay duration:
$(\arcsin(Vt2*(R1+R2)/R2/\sqrt{2}/Vac) - \arcsin(Vt1*(R1+R2)/R2/\sqrt{2}/Vac))/2$, where R1 and R2 are a resistance value of the first resistor and a resistance value of the second resistor, respectively, Vac is an input alternating voltage, Vt1 and Vt2 are a first reference voltage and a second reference voltage, respectively, and the R2 is close to a grounded end.

27. The dimmer detection method according to claim 26, wherein a delay duration is smaller than a duration in which the bus voltage reflecting signal rises from the first reference voltage to the second reference voltage in the absence of a dimmer, and/or are smaller than a duration in which the bus voltage reflecting signal falls from the second reference voltage to the first reference voltage in the absence of a dimmer.

28. The dimmer detection method according to claim 21, wherein step 2 comprises:

counting a rising edge of the delayed first processing signal, when counting to a first preset number, outputting a leading-edge phase-cut dimmer detection signal, and stopping counting, the leading-edge phase-cut dimmer detection signal is effective, wherein the first preset number is integers.

29. The dimmer detection method according to claim 21, wherein step 1 comprises: connecting one end of a first resistor and a second resistor, connected in series, to a rectified voltage obtained after rectifying an input alternating current, and grounding the other end; and outputting, by a connecting point between the first resistor and the second resistor, the signal representing the bus voltage.

30. The dimmer detection method according to claim 29, wherein the second reference voltage is smaller than $R2/(R1+R2)*sqrt(2)*Vac*sin(\theta max)$, where R1 and R2 are a resistance value of the first resistor and a resistance value of the second resistor, respectively, Vac is an input alternating voltage, θmax is a maximum turn-on angle of a dimmer,, and the first reference voltage is smaller than the second reference voltage.

* * * * *